United States Patent [19]

Swirbel et al.

[11] Patent Number: 5,355,016
[45] Date of Patent: Oct. 11, 1994

[54] SHIELDED EPROM PACKAGE

[75] Inventors: Thomas J. Swirbel, Davie; Lonnie L. Barnardoni, Boca Raton; Melanie Williams, Deerfield Beach; James L. Davis, Coral Springs, all of Fla.

[73] Assignee: Motorola, Inc., Schaumburg, Ill.

[21] Appl. No.: 56,278

[22] Filed: May 3, 1993

[51] Int. Cl.⁵ ..................... H01L 25/04; H01L 23/28
[52] U.S. Cl. .................... 257/659; 257/680; 257/787
[58] Field of Search ................ 257/659, 680, 787

[56] References Cited

U.S. PATENT DOCUMENTS

| | | | |
|---|---|---|---|
| 3,614,546 | 10/1971 | Avins | 317/234 R |
| 4,107,555 | 8/1978 | Haas et al. | 257/659 |
| 4,567,317 | 1/1986 | Ehrlich et al. | 174/35 MS |
| 4,723,156 | 2/1988 | Okuaki | 257/681 |
| 4,909,856 | 3/1990 | Ralph | 257/659 |
| 5,153,379 | 10/1992 | Guzuk et al. | 257/659 |
| 5,166,772 | 11/1992 | Soldner et al. | 257/659 |

FOREIGN PATENT DOCUMENTS

| | | | |
|---|---|---|---|
| 0169277 | 10/1982 | Japan | 257/659 |
| 0170575 | 10/1982 | Japan | 257/659 |
| 0191358 | 10/1984 | Japan | 257/659 |
| 60-211962 | 10/1985 | Japan | 357/72 |
| 0275150 | 11/1988 | Japan | 257/659 |
| 0171652 | 7/1991 | Japan | 257/659 |
| 0147652 | 5/1992 | Japan | 257/659 |

Primary Examiner—Rolf Hille
Assistant Examiner—David Ostrowski
Attorney, Agent, or Firm—Dale W. Dorinski

[57] ABSTRACT

A shielded, erasable-programmable-read-only-memory (EPROM) package is provided. A circuit carrying substrate (10), contains an area for mounting an EPROM chip (16), having conductive interconnecting patterns (12) adjacent to the chip mounting area. The EPROM chip is mounted on the circuit carrying substrate, and the pad electrodes on the EPROM chip are connected to pads on the conductive patterns of the substrate by wire bonds (17) or other means. An ultraviolet (UV) light transmitting resin (18) is transfer molded onto the circuit carrying substrate, covering the EPROM chip (16) and the wire bonds (17) so as to provide an optical path through the material to the top surface of the EPROM chip, and sealing the EPROM chip from the exterior of the package. An adherent metal coating (19) is sputtered over the transfer molded resin, and the metal coating is coated with a protective organic resin (15). Both the metal coating and the organic resin are at least partially transparent to ultraviolet light.

13 Claims, 4 Drawing Sheets

SHIELDED EPROM PACKAGE

TECHNICAL FIELD

This invention relates generally to semiconductor device packages and more specifically to a radio frequency shielded package for erasable-programmable-read-only-memory (EPROM) semiconductor devices.

BACKGROUND

Semiconductor device packages or integrated circuit chip carriers find use in a variety of high-density electronics applications. The integrated circuits or semiconductor devices are typically protected from the external environment by encapsulation with an epoxy material (using glob top technology for example) or transfer molding a thermoset or thermoplastic resin about the device. This package provides protection from dust, humidity and other environmental factors which can destroy the delicate circuitry.

A major problem associated with these types of packages is that they do not provide shielding from radiation, such as radio frequency interference (RFI) or electromagnetic interference (EMI). The ability to shield high-frequency circuits, especially in electronic equipment such as two-way radios, is critical. Conventional shielding systems are generally characterized by a conductive metallic enclosure constructed to surround the device to be shielded. This enclosure acts either to protect the electrical equipment from external RFI or EMI signals or to prevent the escape of RFI or EMI signals generated by the device. Typically, these shielded enclosures are made from a conductive material that is electrically coupled to the surrounding area. In prior art, the shielded enclosures have been made by attaching a drawn metallic casing over the semiconductor device and soldering it to a substrate connected to the device.

Unfortunately, this method of shielding is extremely sensitive and very costly and cumbersome when used to shield integrated circuits because of 1) high temperatures generated during the soldering process for attaching the metal shield to the device and 2) the additional thickness or bulk required when adding a shield. Heat generated by the soldering process can result in damage to the integrated circuit. The increase in the overall size of the shielded package is substantial, resulting in a package that is larger than optimum. As a result, a need exists for a method to provide RFI shielding to a high-density integrated circuit package that is economical, does not generate excessive temperatures, and provides a low-profile, high-density package.

Erasable programmable read-only memory (hereinafter called EPROM) packages which can be erased by an ultra-violet (UV) light ray consist of an EPROM chip mounted on a substrate. In prior art plastic packages, the EPROM chip is encapsulated, and a window made of a material capable of transmitting UV (ultraviolet) light, such as UV transparent glass, quartz, alumina, or synthetic resin is securely fixed to the encapsulant with epoxy resin. This structure has such poor moisture resistance that water or corrosive ions, such as sodium, potassium, or chloride ions, penetrate the window through the portion at which the window and the encapsulant are joined, thereby causing corrosion or leakage between electrodes of the EPROM chip 14. Some packaging methods passivate the EPROM chip with a resin, typically a silicone resin, capable of transmitting UV light, filling the space above the chip. Conventional EPROM packages suffer from a number of disadvantages, such as:

(1) UV light permeable silicone resins have relatively low adhesive strength and high water permeability, hence the moisture resistance of the package is poor. Additionally, since the plastic package has relatively low resistance to thermal stress, the quality of the package is degraded by repeated thermal cycling.

(2) The silicone resin used in the plastic package is rather expensive, and even though it provides sufficient UV transmittance, it would be desirable to eliminate it.

(3) The difference in thermal expansion coefficients between the epoxy sealing resin, the base material, the cover, and the UV light permeable resin sometimes generates cracks in the UV light permeable resin.

(4) Assembly requires substantial time.

(5) The need to add a separate cover and UV window to the cover creates a finished assembly which is larger and taller than desired. A package with less wasted space in the horizontal and vertical directions would be desirable.

Clearly, a need exists for an electromagnetically shielded package for an EPROM that overcomes the deficiencies of the prior art.

SUMMARY OF THE INVENTION

Briefly, according to the invention, there is provided a shielded, erasable-programmable-read-only-memory (EPROM) package. A circuit carrying substrate contains an area for mounting an EPROM chip and conductive interconnecting patterns adjacent to the chip mounting area. The EPROM chip is mounted on the circuit carrying substrate, and the pad electrodes on the EPROM chip are connected to pads on the conductive patterns of the substrate by wire bonds or other means. An ultraviolet (UV) light transmitting resin is transfer molded onto the circuit carrying substrate, covering the EPROM chip and the wire bonds so as to provide an optical path through the material to the top surface of the EPROM chip, and sealing the EPROM chip from the exterior of the package. An adherent metal coating is sputtered over the transfer molded resin, and the metal coating is coated with a organic protective resin. Both the metal coating and the organic resin are at least partially transparent to ultraviolet light.

In an alternate embodiment, a method of manufacturing a shielded EPROM package comprises the steps of:
1. Providing a substrate of insulating material with a metallization pattern on at least one side, and an EPROM chip mechanically and electrically attached to the metallization pattern;
2. Encapsulating the EPROM chip and the metallization pattern in a resin that is at least partially transparent to UV light;
3. Vacuum depositing an adherent metal coating that is at least partially transparent to UV light, over the resin and a portion of the substrate; and
4. Coating the adherent metal coating with an adherent organic coating that is at least partially transparent to UV light.

DETAILED DESCRIPTION OF THE PREFERRED EMBODIMENT

Figure 1:
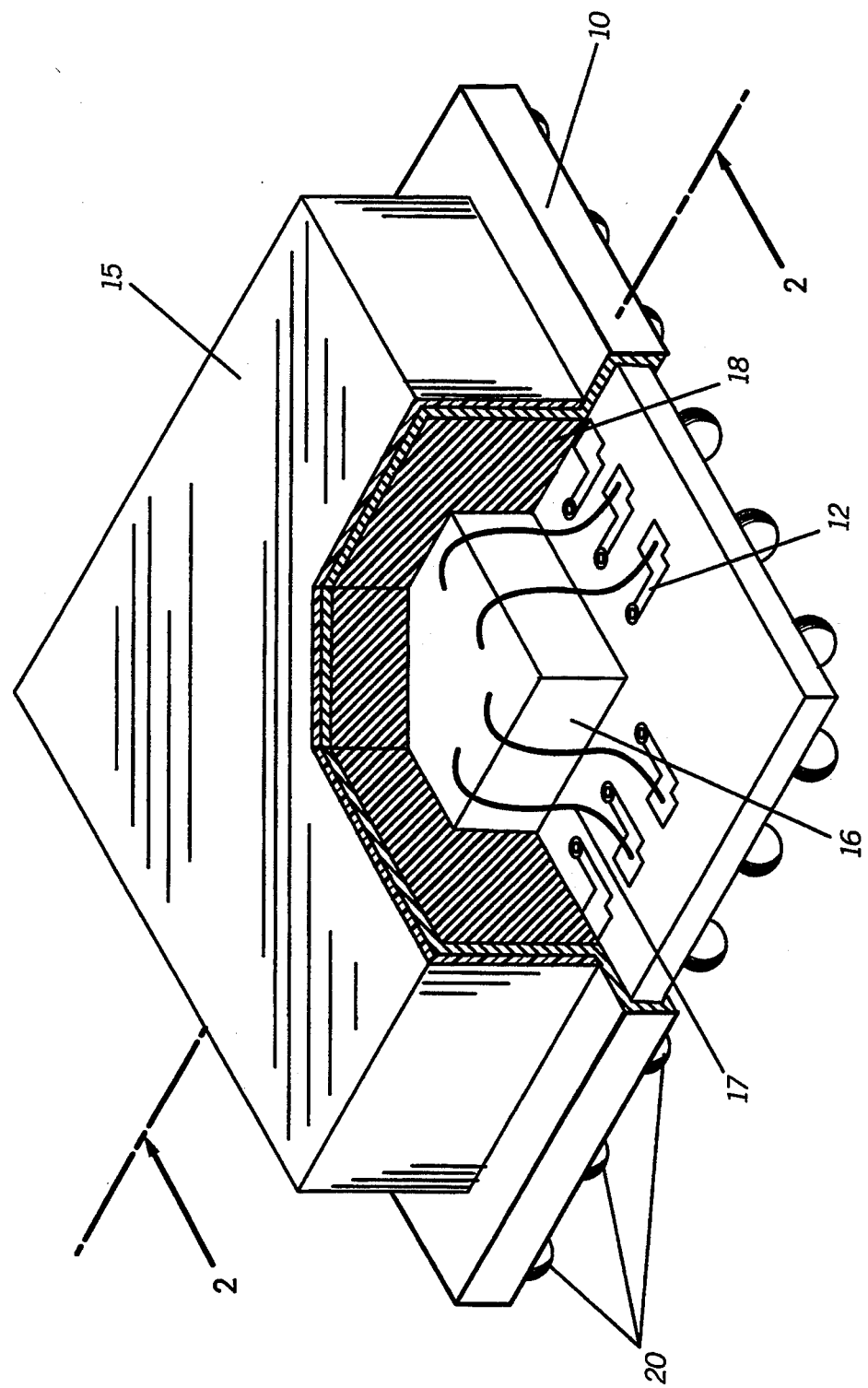
FIG. 1 is an isometric cut-away view of a shielded EPROM package in accordance with the present invention.

While the specification concludes with claims defining the features of the invention that are regarded as novel, it is believed that the invention will be better understood from a consideration of the following description in conjunction with the drawing figures, in which like reference numerals are carried forward.

Figure 2:
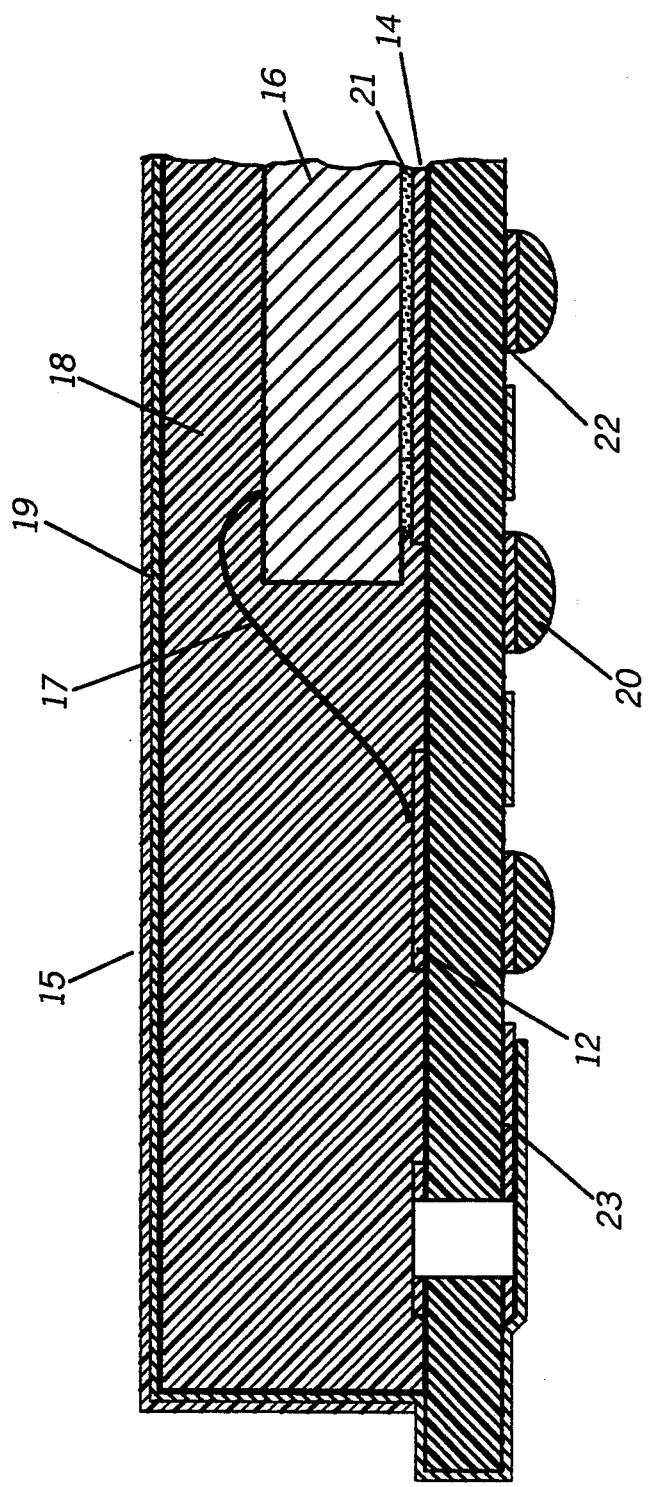
FIG. 2 is a cross-sectional view of a shielded EPROM package through section 2—2 of FIG. 1.

Referring to FIGS. 1 and 2, a substrate 10 is provided as a carrier for a metallization pattern. The substrate material may be any one of a number of materials commonly used in the industry, such as polyester, polyimide, polyetherimide, polytetrafluoroethylene, glass reinforced printed circuit board materials, metal, ceramics, or glass, and may be rigid or flexible. Substrate thickness may vary from approximately 0.001 inches to 0.250 inches, with thicknesses ranging from 0.005 to 0.075 being preferred.

The metallization pattern has a chip mounting portion 14 and conductive interconnection patterns 12. An EPROM chip 16 is mounted on the chip mounting portion 14 by, for example, a conductive adhesive 21, in such a manner that the active surface thereof faces upward. Nonconductive adhesives may also be utilized if electrical conductivity between the chip and the mounting pad is not required. Each of the pad electrodes of the EPROM chip 16 is connected to an interconnect pad 12 with thin metal wires 17 of gold or aluminum. These attachment methods are common in the industry and are well known to those skilled in the art.

The combined portion comprising the thin metal wires 17 and the EPROM chip 16, is encapsulated by transfer molding or glob-topping a resin 18 which is transparent to UV light. In the case of transfer molding, the assembly is placed into a transfer mold and a thermoplastic or thermoset transfer molding compound 18 is molded around the semiconductor device 16 to form a solid mass. The transfer molding compound 18 totally encapsulates the semiconductor device 16, the associated wirebonds 17, and portions of the metallization pattern and substrate. Transfer molding is accomplished by placing the printed circuit board with the wire bonded EPROM chip into a transfer molding machine. The UV transparent plastic encapsulating resin is preheated and forced from a pot into the hot mold cavity, and upon solidification, the molded part is ejected from the mold. The techniques and equipment for performing transfer molding are well known to those skilled in the art, for example in U.S. Pat. 4,822,550. In the case of glob top encapsulation, a thermoset material is placed over the semiconductor device, and heated in an oven to flow out and encapsulate the device and the associated wirebonds. The heating cycle also cures the material to form a hard, monolithic material that protects the device from environmental damage.

Encapsulating materials such as epoxies, polyesters, polyetherimides, acrylics, ally diglycol carbonates, cellulose acetate butyrate, phenolics, polyphenylene oxide, polyphenylene sulfide, polyphenyl sulfone, polyaryl sulfones, polyarylates, polycarbonates, and polyvinyl chloride may be used, and a transparent epoxy transfer molding compound such as Nitto 8500 from Nitto Electric Ltd. of Japan has been found to be particularly useful. Candidate materials should possess greater than 50% transmittance to light of about 254 nanometers wavelength, and be able to be used in a transfer molding operation. Both thermoset and thermoplastic materials may be utilized.

The resultant package has sealed the EPROM chip 16 and the wire bonds 17 from the exterior of the package, creating a solid, monolithic unit that provides resistance to environmental contamination, while allowing the surface of the EPROM chip 16 to be erased by UV light.

In another embodiment of the invention, the EPROM package is formed about a metal lead frame containing a chip mounting portion and a plurality of terminal portions. In the case of EPROM chips that are TAB bonded directly to the lead frame, the chip mounting portion is not present in the lead frame. Each terminal portion terminates in an area adjacent to the chip mounting portion, providing sites for electrical connection of the electrode pads of the chip to the leads. The formation and layout of metal lead frames is well known to those skilled in the art. An EPROM chip containing electrode pads is bonded or mounted on the chip mounting portion of the lead frame. After wire-bonding with thin metal wires 46, such as gold or aluminum, between the chip and the leads, the package is formed by placing the lead frame assembly into the cavity of a mold and transfer molding a resin, which is transparent to UV light, substantially about the lead frame. The design of the mold cavity is such as to allow the legs of the lead frame to extend beyond the transfer molded body of the package, thereby forming a dual-in-line package. Other configurations, such as folding the legs under the package to form a plastic leaded chip carrier (PLCC), or bonding the chip directly to the lead frame to form a flat package, may also be employed, and still considered to be within the spirit of the invention.

The EMI/RFI shield is added to the package by coating the package with a metal film or coating 19. This is accomplished by, for example, vacuum depositing a film of metal onto the encapsulated assembly. Methods of vacuum deposition such as sputtering and evaporation have been found to be effective. The coating is typically formed of a very thin (less than about 1000 Å) of copper or other suitable metals, with 100 Å of copper being preferred. Because the coating is very thin, it is also capable of transmitting ultraviolet light. The thin coating is also electrically conductive, thereby providing an EMI/RFI shield. A trade-off between optical transparency and mechanical durability of the film occurs, and care must be exercised in order to maintain the transparent properties of the film. It has been found that a copper film thickness of about 100 Å provides the best trade-off of properties. Areas where a continuous metal coating is not desired, such as in the areas of the interconnection pads of the assembly, may be etched away with, for example, acids. To do this, the package is masked off with a photoresist, for example, and developed to expose the desired metal areas to the acids. After etching, the photoresist is removed to reveal the completed package. The openings in the conductive shield may also be defined by applying the photoresist prior to the initial metallization, in which case the photoresist is only applied over the areas where metal is not desired. In both of these methods, the metal is normally connected to at least one conductor of the substrate in order to interconnect the metal shield with the grounding circuit of the semiconductor device. This may be accomplished by not etching away the metal shield in the area of the ground pad, leaving the shield/ground pad interconnection intact.

Figure 3:
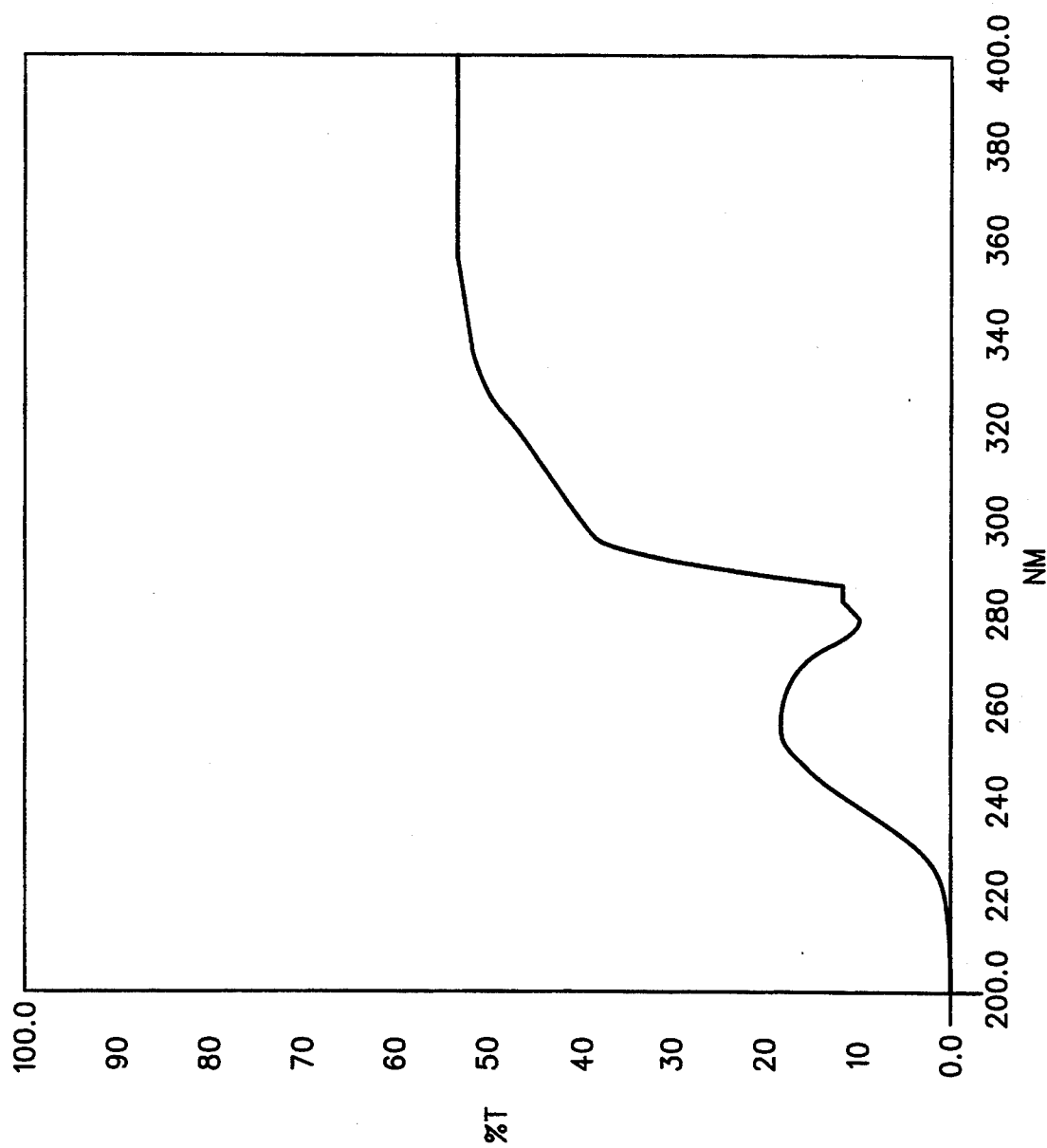
FIG. 3 is a graph of the percent transmission of an organic coating over copper as a function of wavelength.
Figure 4:
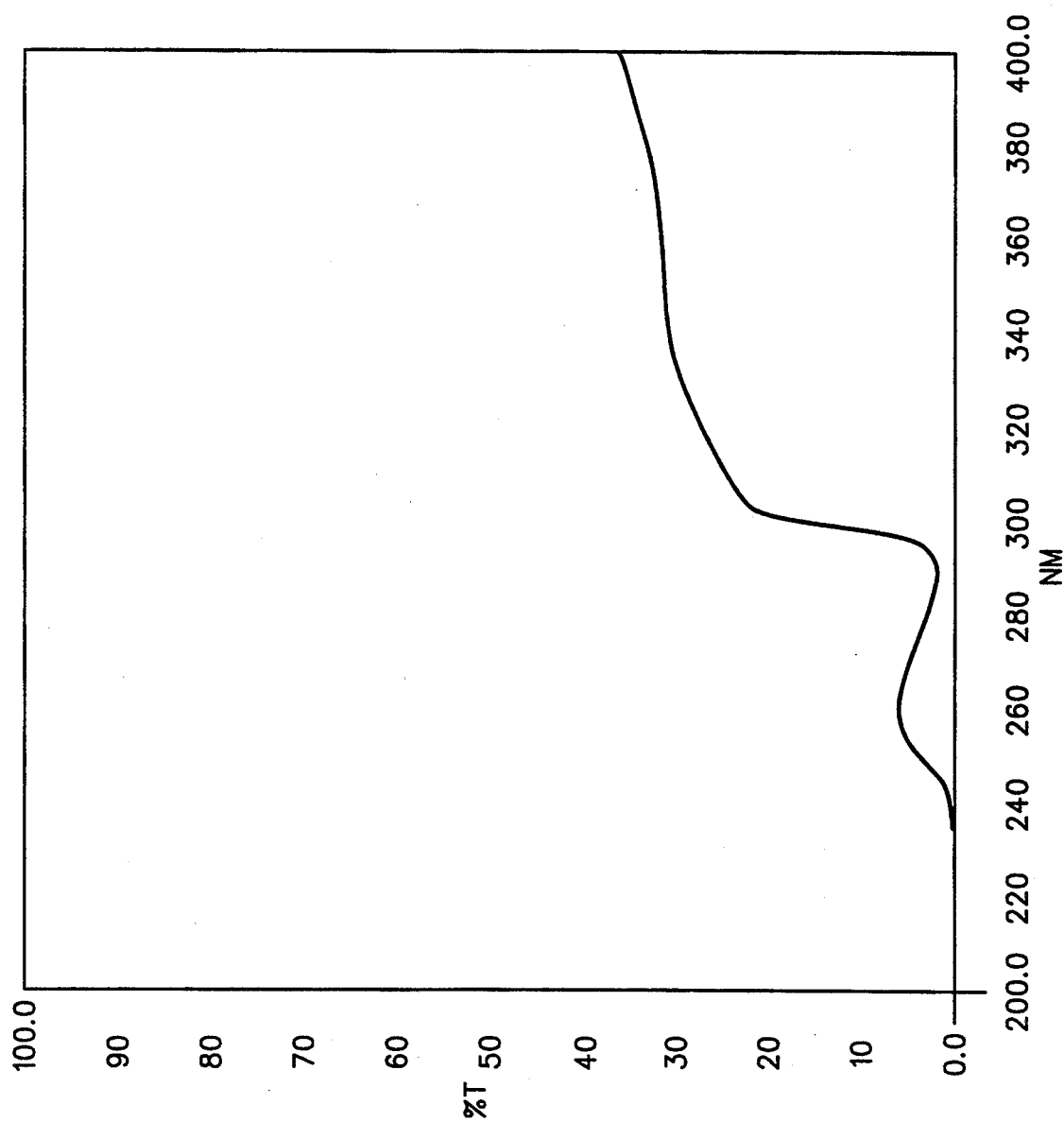
FIG. 4 is a graph of the percent transmission of a photoresist coating over copper as a function of wavelength.

The EMI/RFI shield is then coated with an organic protective coating 15 which is capable of transmitting ultraviolet light. Since the metal coating 19 is so thin, it is important that it be protected from oxidation, in order to maintain electrical conductivity. Oxidation of the copper alters the conductivity of the film. Several materials may be used for coatings, such as photoresists that are at least partially transparent to UV light, and protective azole coatings such as benzimidazoles, benzotriazole, or other substituted imidazoles that form chemically bonded protective coatings with copper. One such commercially available coating, known as ENTEK TM from Enthone Corporation, is preferred, as it provides high temperature stability. SCHERCOAT TM from Schering Company, and PROTECTO TM from Kester Solder Company are other examples of commercial organic protective coatings for copper. The organic protective coating 15 is deposited as a thin coating so as to be at least partially transparent to UV light. FIG. 3 shows a graph of the percent transmission of approximately 2000 Å of the ENTEK TM coating over 100 Å of copper as a function of wavelength, and FIG. 4 shows a graph of the percent transmission of a photoresist coating over 100 Å of copper as a function of wavelength. Various thicknesses of the protective organic coating may be used, but it is important that the selected coating be at least partially transparent to UV light. The organic coating forms a strong bond with the copper, and provides protection to the underlying metal coating against oxidation and corrosion.

Referring now to FIG. 2, the package after molding consists of a semiconductor device 16 mounted on a die mounting pad 14 by means a conductive adhesive 21. The device 16 is electrically interconnected the wire bond pads 15 by means of wire bonds 17. The device, the upper surfaces of the metallization pattern and substrate, and the associated wirebonds are substantially encapsulated by transfer molding compound 18. The metal film or coating 19 is applied as described immediately above, and forms a continuous shield around the encapsulated package. The interconnection pads 22 are exposed and are not interconnected with the metal shield 19. The shielding metal does not have to appear on both sides of the side of the substrate, as shown in FIG. 2, but may be modified to leave the interconnection pads 22 unshielded. The metal shield 19 is connected to the package ground 23 by leaving a portion of the shield intact. The ground connection may also be made on the upper surface of the substrate by extending the grounding metallization beyond the perimeter of the molding compound. The thickness of the shield may be selectively increased, if desired, by additional plating. Further, the pads 22 may be bumped with solder balls or bumps 25. Typically, these bumps are arranged in an array to form a shielded EPROM pad array chip carrier.

Accordingly, this invention provides a number of advantages. Note that the package is smaller in the vertical dimension and lighter than that constituted by prior art packages. No additional soldering or other type of physical interconnection is required to connect the shield to the package ground. The size and cost of the package is reduced in all cases, and significantly reduced in those cases where complex shields are required. Reliability is increased because the heat of soldering a separate metal shield is not required, thereby eliminating the potentially hazardous exposure of the semiconductor device to high temperatures. The small size of the package, coupled with the improved shielding capability allow this package to be advantageously employed in applications such as portable radio transmitters, portable telephones, or portable radio receivers. The package seals the EPROM chip and the wire bonds from the environment, creating a solid, monolithic unit and thereby protecting the EPROM chip against outside moisture and corrosive ions. Improved resistance to environmental contamination is provided, while allowing the surface of the EPROM chip to be erased by UV light. Since the EPROM package of the invention is formed by a single molding operation enclosing the EPROM chip, and uses a single resin, the cost of manufacture of the package is reduced in comparison with the prior art EPROM packages. Additionally, since the molding temperature at which the EPROM chip is encapsulated is low, the thermal stress imparted to the EPROM chip is reduced, which makes it possible to use thin metal wires of gold, which is preferable for use with high speed wire-bonding techniques. The need to provide a separate window in the package cover is obviated, thus reducing the complexity and cost of the package. The interface between a transparent window and the cover is also eliminated, thus eliminating a further site of intrusion of environmental contaminants.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A shielded monolithic EPROM package, comprising:
    a circuit carrying substrate having conductive interconnecting patterns on a first surface;
    an EPROM chip having an optically erasable surface, electrically and mechanically attached to the circuit carrying substrate;
    an encapsulant material, at least partially transparent to UV light, molded on the circuit carrying substrate and covering the EPROM chip and associated chip interconnections so as to provide an optical path through the encapsulant material to the EPROM erasable surface;
    an adherent metal coating, at least partially transparent to UV light, applied over the encapsulant material for shielding the semiconductor device from radio frequency energy; and
    an adherent organic coating, at least partially transparent to UV light, applied over the metal coating.

2. The shielded monolithic EPROM package according to claim 1, wherein the adherent metal coating comprises a vacuum deposited metal coating.

3. The shielded monolithic EPROM package of claim 1, wherein the encapsulant material, the adherent metal coating, and the adherent organic coating are substantially transparent to UV light of about 254 nanometer wavelength.

4. The shielded monolithic EPROM package of claim 3, wherein the encapsulant material is selected from the group consisting of epoxy, polyester, polyetherimide, acrylic, cellulose acetate butyrate, phenolic, polyphenylene oxide, polyphenylene sulfide, polyphenyl sulfone, polyaryl sulfone, polyarylate, polycarbonate, and polyvinyl chloride.

5. The shielded monolithic EPROM package of claim 1, wherein the circuit carrying substrate comprises a material selected from the group consisting of epoxy, polyimide, polyester, polyetherimide, polyethylene, and polytetrafluoroethylene.

6. The shielded monolithic EPROM package of claim 1, further comprising solder bumps on a second opposing surface of the substrate, the solder bumps electrically connected to the conductive interconnecting pattern.

7. The shielded monolithic EPROM package of claim 1, wherein the adherent organic coating is selected from the group consisting of photoresist, azole polymers, benzimidazole, benzotriazole, and substituted imidazoles that form chemically bonded protective coatings to copper.

8. A shielded monolithic EPROM package including a radio frequency shield for at least one semiconductor device, comprising:

a printed circuit substrate having a chip mounting portion and conductive interconnecting patterns on a first side, the interconnecting patterns including pads adjacent to the chip mounting portion;

solder bumps on a second opposing side of the printed circuit substrate, the solder bumps electrically connected to the conductive interconnecting pattern;

an EPROM chip having an optically erasable surface, the chip mounted on the chip mounting portion, and electrically connected to the pads by means of thin wires;

an epoxy resin, at least partially transparent to UV light, transfer molded on the printed circuit substrate and covering the EPROM chip and the thin wires so as to provide an optical path through the epoxy resin to the erasable surface of the EPROM chip, the epoxy resin sealing the EPROM chip from the exterior of the EPROM package;

an adherent metal coating, at least partially transparent to UV light, deposited on the epoxy resin and a portion of the printed circuit substrate so as to electrically couple the conductive interconnecting pattern to the adherent metal coating to provide a shield for substantially reducing the ingress or egress of radio frequency signals through the package; and an adherent organic coating, at least partially transparent to UV light, applied over the conductive metal coating, the adherent organic coating selected from the group consisting of photoresist, azole polymers, benzimidazole, benzotriazole, and substituted imidazoles.

9. The shielded monolithic EPROM package according to claim 8, wherein the adherent metal coating comprises a vacuum deposited metal coating.

10. The shielded monolithic EPROM package of claim 8, wherein the epoxy resin is substantially transparent to UV light of about 254 nanometer wavelength.

11. The shielded monolithic EPROM package of claim 8, wherein the printed circuit substrate comprises a material selected from the group consisting of epoxy, polyimide, polyester, polyetherimide, polyethylene, and polytetrafluoroethylene.

12. The shielded monolithic EPROM package of claim 8, wherein the printed circuit substrate comprises a glass fiber reinforced rigid member.

13. The shielded monolithic EPROM package of claim 8, wherein the solder bumps are formed in an array.

* * * * *

UNITED STATES PATENT AND TRADEMARK OFFICE
CERTIFICATE OF CORRECTION

PATENT NO. : 5,355,016
DATED : October 11, 1994
INVENTOR(S) : Swirbel, et al.

It is certified that error appears in the above-indentified patent and that said Letters Patent is hereby corrected as shown below:

Title page, item [75]: delete "Barnardoni" and insert therefor -- Bernardoni --.

Signed and Sealed this

Twenty-first Day of March, 1995

*Attest:*

BRUCE LEHMAN

*Attesting Officer*     *Commissioner of Patents and Trademarks*